(12) United States Patent
Tang et al.

(10) Patent No.: US 7,323,853 B2
(45) Date of Patent: Jan. 29, 2008

(54) LOW DROP-OUT VOLTAGE REGULATOR WITH COMMON-MODE FEEDBACK

(75) Inventors: Xiaohu Tang, Shanghai (CN); Wei Wang, Shanghai (CN); XiaoHua Hou, Shanghai (CN); Shiqiang Liu, Sichuan (CN)

(73) Assignee: 02Micro International Ltd., Georgetown (KY)

( * ) Notice: Subject to any disclaimer, the term of this patent is extended or adjusted under 35 U.S.C. 154(b) by 0 days.

(21) Appl. No.: 11/172,444

(22) Filed: Jun. 30, 2005

(65) Prior Publication Data

US 2006/0197513 A1    Sep. 7, 2006

Related U.S. Application Data

(60) Provisional application No. 60/657,959, filed on Mar. 1, 2005.

(51) Int. Cl.
G05F 1/575 (2006.01)
G05F 1/565 (2006.01)

(52) U.S. Cl. ............................................ 323/280
(58) Field of Classification Search .............. 323/265, 323/273, 274, 275, 280; 330/258, 260, 271, 330/291
See application file for complete search history.

(56) References Cited

U.S. PATENT DOCUMENTS 5,939,867 A * 8/1999 Capici et al. ............... 323/277
6,703,816 B2 * 3/2004 Biagi et al. ................. 323/280
6,774,722 B2 * 8/2004 Hogervorst ................. 330/258
6,917,187 B2 * 7/2005 Okubo et al. ............... 323/275
7,053,712 B2 * 5/2006 Bonaccio et al. ........... 330/258

OTHER PUBLICATIONS

Opamps With Local Common-Mode Feedback; Jeffrey Harrison; Aug. 7, 2001.
Simple Technique Using Local CMFB to Enhance Slew Rate and Bandwidth of One-Stage CMOS OP-Amps: J. Ramirez-Angulo and M. Holmes; Electronics Letters; Nov. 7, 2002, vol. 38, N. 23.

* cited by examiner

*Primary Examiner*—Gary L Laxton
(74) *Attorney, Agent, or Firm*—Li K. Wang; Wang Law Firm, Inc.

(57) ABSTRACT

The present invention is a LDO voltage regulator circuit with common-mode feedback. The LDO voltage regulator includes an error amplifier with a common-mode feedback unit, a pass device and a compensation circuit. A signal from the pass device acts as an input signal to the error amplifier and is compared with another input signal, producing a differential signal. The differential signal is amplified and then provided to the pass device. A capacitor in the compensation unit provides frequency compensation to the LDO voltage regulator. The common-mode feedback unit incorporated into the error amplifier greatly improves a slew rate of a gate voltage of the pass device.

23 Claims, 5 Drawing Sheets

US 7,323,853 B2

LOW DROP-OUT VOLTAGE REGULATOR WITH COMMON-MODE FEEDBACK

RELATED APPLICATION

This application claims the benefit of U.S. provisional application, titled Low-Voltage, Low Drop-out Voltage Regulator with a Common-Mode Feedback Operational Amplifier, Ser. No. 60/657,959, filed on Mar. 1, 2005, the specification of which is incorporated herein in its entirety by this reference.

BACKGROUND OF THE INVENTION

1. Field of the Invention

The present invention relates to voltage regulator and in particular to a low drop-out voltage regulator with low power dissipation.

2. Description of the Related Art

Currently, the increasing demand for higher performance power supply circuits has resulted in a continued development of voltage regulator devices. Many low voltage applications, such as for use in cell phones, pagers, laptops, camera recorders and other mobile battery operated devices, require the use of low drop-out (LDO) voltage regulators. These portable electronics applications typically require low voltage and small quiescent current flow to increase the battery efficiency and longevity.

The LDO voltage regulators generally can provide a well-specified and stable DC voltage whose input to output voltage difference is low. The LDO voltage regulators are usually configured for providing the power requirements to electrical circuits. The LDO voltage regulators typically have an error amplifier, and a pass device, e.g., a power transistor. These two components are coupled in series. The error amplifier is coupled to an input terminal of the LDO voltage regulators, and the pass device is coupled to an output terminal of the LDO voltage regulators. The pass device can then drive an external load.

In general, a feedback circuit is further provided to the LDO voltage regulators scaling the output voltage down and feeding back a scaled down voltage to the error amplifier. The LDO voltage regulators can further incorporate a compensation circuit to form a control loop and to provide Miller compensation in order to improve the stability of the LDO voltage regulators.

The pass device also introduces a large parasitic capacitance to the LDO voltage regulator. The large parasitic capacitance between a gate terminal of the pass device and the AC ground, for example 100 pF or more, can limit the capability of the error amplifier, since the parasitic capacitance needs to be charged or discharged during a certain period in order to restore the output voltage of the LDO voltage regulator to a constant value. The performance of the LDO voltage regulator is, therefore, greatly limited by the speed of the parasitic capacitance being charged and discharged which is defined a slew rate. Additionally, the presence of the large parasitic capacitance can produce a significant pole in the frequency response of the error amplifier, which can result in the error amplifier more difficult to be stable. The large parasitic capacitance in the pass device usually requires the configuration of a buffer, for example, a source follower or a unity-gain buffer, to isolate the high output resistance of the gain stage of the error amplifier from the large parasitic capacitance.

Conventionally, a dynamic bias circuit is inserted at a slew-rate limited node to provide an improved transient response performance. However, the insertion of the dynamic bias circuit can increase the complexity of the LDO voltage regulator. The insertion of the dynamic bias circuit may also create stability problems and cause the design of the LDO voltage regulator to become more complex. In addition, the LDO voltage regulator generally has a lower efficiency due to a higher ground current consumed by the dynamic bias circuit.

It is thus desirous to have an apparatus and method that can provide a stable output voltage with a higher slew rate and simple configuration when the capacitance of a load varies in a larger range and at the same time output a corresponding current with low power dissipation, high driving capacity and good stability. It is to such an apparatus and method the invention is primarily directed.

SUMMARY OF THE INVENTION

In one embodiment, the invention is a LDO voltage regulator circuit with common-mode feedback. The LDO voltage regulator circuit includes an error amplifier with a common-mode feedback unit for generating an amplified error voltage, a pass device for providing an output voltage to drive at least one external component, a feedback circuit for scaling down the output voltage, and a compensation circuit for providing compensation. The error amplifier has a first input terminal for receiving a reference voltage, a second input terminal for receiving a feedback voltage, a third input terminal, and an output terminal. The pass device has an input terminal and an output terminal, and the input terminal of the pass device is connected to the output terminal of the error amplifier. The feedback circuit has a first terminal and a second terminal. The first terminal of the feedback circuit is connected to the output terminal of the pass device, and the second terminal of the feedback circuit is connected to the second input terminal of the error amplifier. The compensation circuit has a first terminal and a second terminal. The first terminal of the compensation circuit is connected to the output terminal of the pass device, and the second terminal of the compensation unit is connected to the third terminal of the error amplifier.

In yet another embodiment, the invention is a method for outputting a stable voltage in a low drop-out voltage regulator circuit with common-mode feedback. The method includes the steps for generating an amplified voltage at an error amplifier, driving a pass device with the amplified voltage, increasing a slew rate for a gate voltage of the pass device through use of a common-mode feedback unit in the error amplifier, obtaining an output voltage from the pass device, and providing frequency compensation to stabilize the output voltage.

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION OF THE INVENTION

Figure 1:
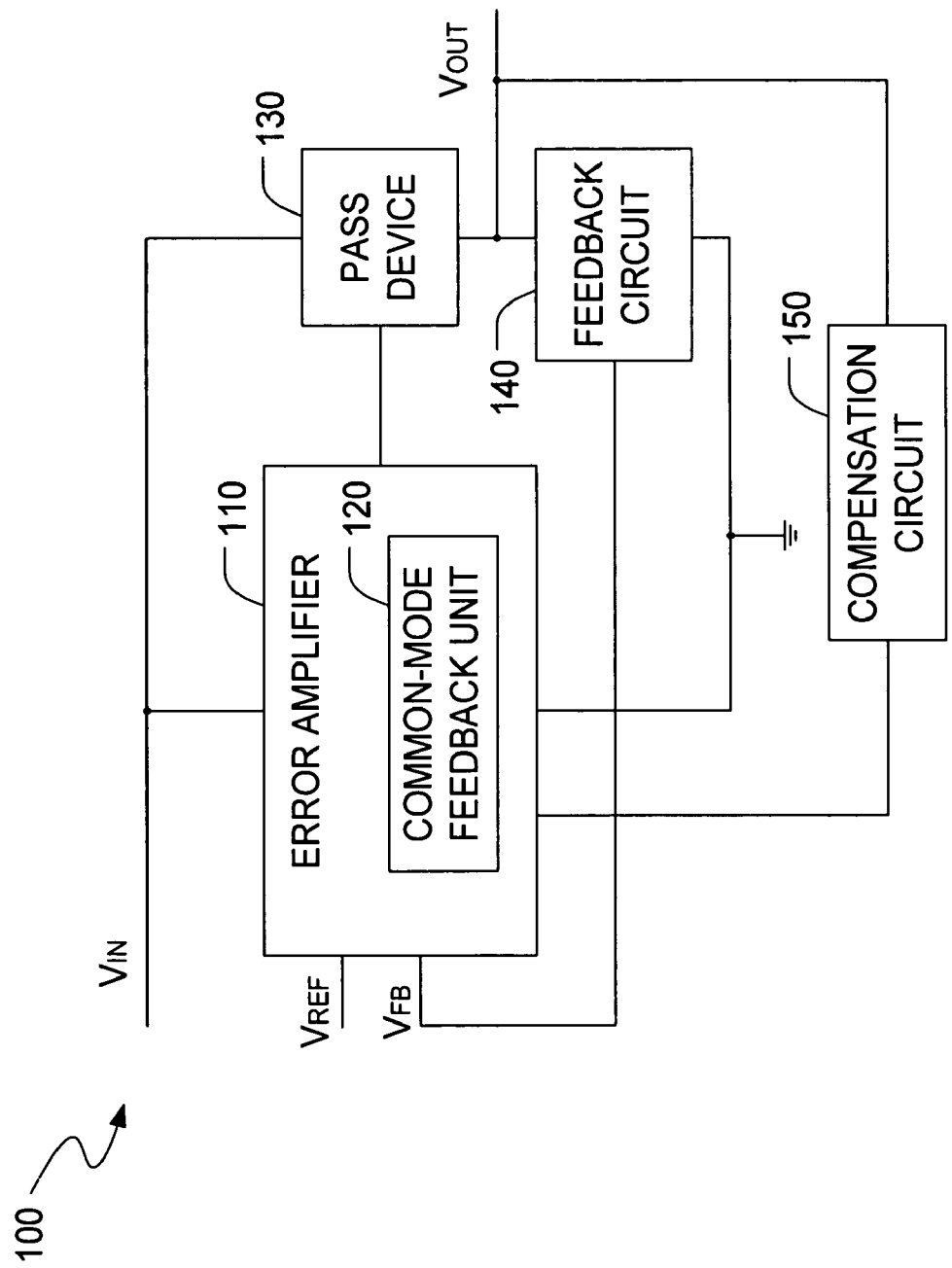
FIG. 1 is a block diagram of a low drop-out voltage regulator (LDO) with common-mode feedback.

The invention provides a LDO voltage regulator with common-mode feedback, so that the LDO voltage regulator can quickly restore an output voltage to a stable condition when an external load varies in different conditions. FIG. 1 illustrates a block diagram of a LDO voltage regulator 100 with common-mode feedback. The voltage regulator 100 includes an error amplifier 110, a pass device 130, a feedback circuit 140, and a compensation circuit 150. The voltage regulator 100 can further include a common-mode feedback unit 120 to increase the response speed of the LDO structure through enlarging the slew rate for a gate voltage of a MOS transistor incorporated in the pass device 130. A power supply voltage $V_{IN}$ is provided to the error amplifier 110, and the pass device 130, respectively. The pass device 130 can provide an output voltage $V_{OUT}$ at an output terminal to an external load (not shown).

The error amplifier 110 can amplify a differential value between two input signals and then output the amplified value at its output terminal. A first signal, for example, a predetermined reference voltage $V_{REF}$ is provided to an inverting input terminal of the error amplifier 110, and a second signal $V_{FB}$ from the feedback circuit 140 is transmitted back to a non-inverting input terminal of the error amplifier 110. The differential value is given by the second signal $V_{FB}$ subtracted from the first signal $V_{REF}$, and then the amplified value is provided to the pass device 130. The error amplifier 110 further includes a common-mode feedback unit 120. The common-mode feedback unit 120 incorporated in the error amplifier 110 can increase the slew rate of the pass device 130 so that the LDO voltage regulator 100 can provide a stable voltage within a transient time.

The pass device 130 is driven by the output voltage from the error amplifier 110, and provides an output voltage $V_{OUT}$ to the external load as an effective power supply with a desirable output current (not shown). When the external load varies, the pass device 130 can be configured to produce a stable output voltage at its output terminal. The feedback circuit 140 can scale the output voltage $V_{OUT}$ based on a specific proportion, which depends on a topology of the voltage regulator 100. The feedback circuit 140 may feed the scaled voltage, for example, $V_{FB}$, back to the error amplifier 110. The compensation circuit 150 can provide a capacitance for frequency compensation depending on various conditions of the external load so that the output voltage $V_{OUT}$ can be kept stable.

Figure 2:
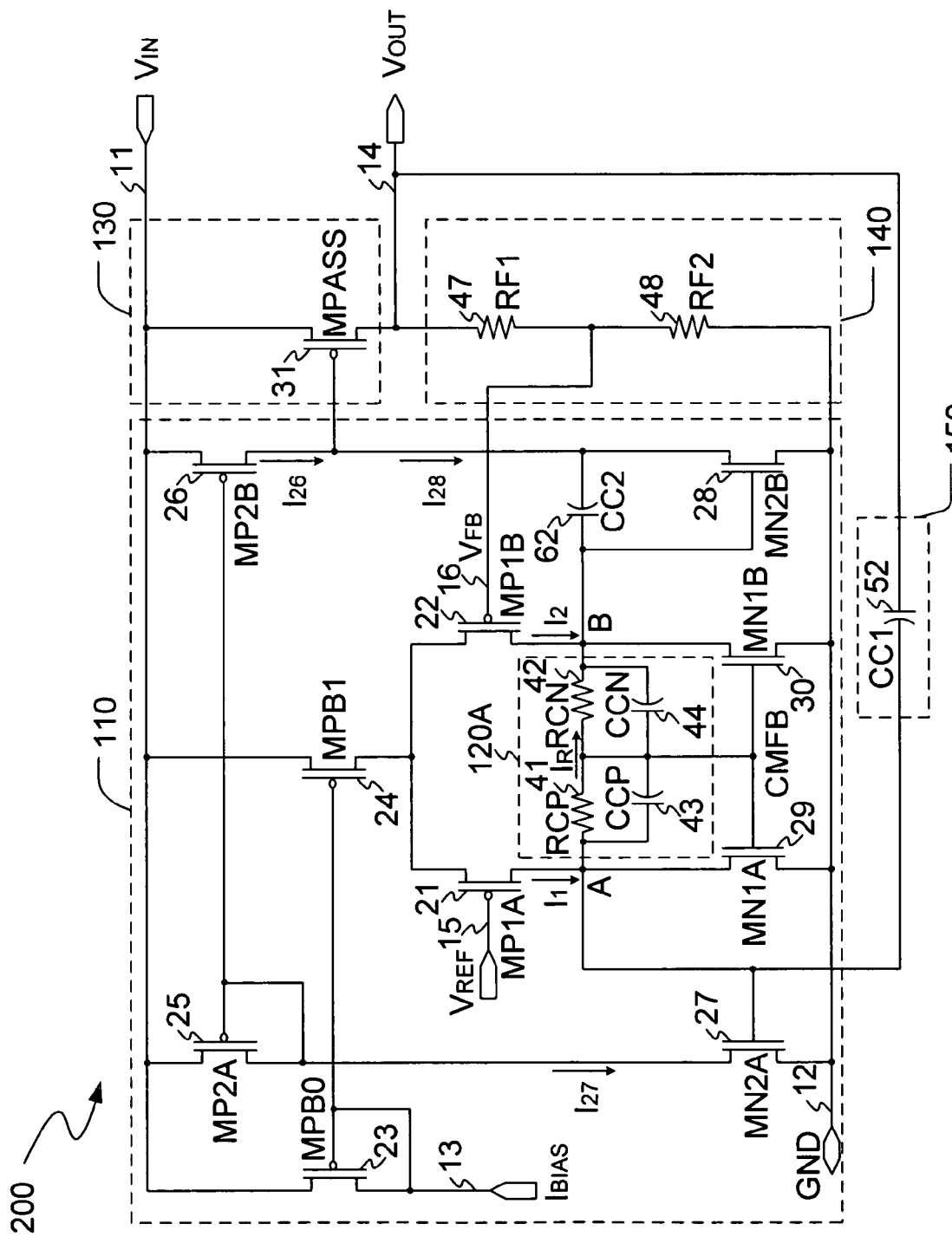
FIG. 2 is a schematic diagram of a LDO voltage regulator of FIG. 1 according to one embodiment of the invention.

FIG. 2 illustrates a schematic diagram of an exemplary embodiment 200 of the LDO voltage regulator 100 of FIG. 1. The voltage regulator 200 includes an error amplifier 110, a pass device 130, a feedback circuit 140, and a compensation circuit 150. The error amplifier 110 further includes a common-mode feedback unit 120A to greatly increase the response speed of the LDO voltage regulator configuration. A power supply $V_{IN}$ is provided to the error amplifier 110, and the pass device 130 between a supply rail 11 and a ground rail 12. A sinking bias current $I_{BIAS}$ from a current source (not shown) is provided on an input line 13. The pass device 130 outputs an output voltage $V_{OUT}$ to drive an external load (not shown) on an output line 14.

In the error amplifier 110, differential input signals on line 15 and line 16 are provided to respective gate terminals of a differential pair of PMOS transistors 21, 22. PMOS transistors 23 and 24, 25 and 26 can form two separate current mirrors. The PMOS transistor 23 can establish an internal bias voltage based on the input bias current $I_{BIAS}$ on line 13. The PMOS transistors 24 can be biased by the bias voltage. The mirrored bias current in the PMOS transistor 24 can activate the PMOS transistors 21 and 22. Receiving the voltage $V_{REF}$ and $V_{FB}$ on lines 15 and 16, the differential pair of the PMOS transistors 21 and 22 can begin to operate. Similarly, the current in the PMOS transistors 21 and 22 can activate NMOS transistors 29 and 30, respectively. Voltages $V_A$ and $V_B$ at node A and node B can, respectively, activate NMOS transistors 27 and 28. The operation of the NMOS transistor 27 can activate the current mirror formed by the PMOS transistors 25 and 26. A drain terminal of the PMOS transistor 26 can output a signal to drive the pass device 130. In addition, the error amplifier 110 further includes a capacitor 62 to optimize the frequency compensation made by the compensation circuit 150.

The common-mode feedback unit 120A includes resistors 41 and 42. The resistor 41 is connected between the node A and a node CMFB, and the resistor 42 is connected between the node B and the node CMFB. A capacitor 43 is connected in parallel to the resistor 41 to provide further frequency compensation. A capacitor 44 is connected in parallel to the resistor 42 and also provides further frequency compensation.

The pass device 130 can be formed by a PMOS transistor 31. A gate terminal of the PMOS transistor 31 can sense the variation of the output current on line 14 which will be further described below. Finally, the PMOS transistor 31 provides an output voltage $V_{OUT}$ with driving capacity, for example, the PMOS transistor 31 can output approximately a current of 130 mA on line 14 that supplies the power to the external load.

A resistive divider is employed as the feedback circuit 140. The resistive divider includes a first resistor 47 and a second resistor 48 coupled in series. The resistors 47 and 48 can scale down the output voltage $V_{OUT}$ on line 14 according to different values of resistors 47 and 48 and feed a voltage lower than the $V_{OUT}$ back to a gate terminal of the PMOS transistor 22. As shown, the resistors 47 and 48 can implement a feedback system for the voltage regulator system and the feedback voltage can be adjusted by selecting different values for the resistor 47 and 48.

The compensation circuit 150 includes a Miller compensation capacitor 52. The compensation circuit 150 is coupled between the output voltage $V_{OUT}$ and the node A. The compensation circuit 150 basically provides a compensation to ensure the voltage regulator 200 outputs a stable $V_{OUT}$ utilizing the Miller effect.

Traditionally, a load capacitor with an equivalent serial resistance (ESR) (not shown) is coupled in parallel with the external load, and it is connected between an output terminal of the voltage regulator and the ground. In this embodiment, $I_C$ is defined as a current flowing through the load capacitor, and $I_{LOAD}$ indicates a current flowing through the external load.

In a transient condition, if the load current $I_{LOAD}$ increases, the load capacitor will discharge so as to charge the external load. Consequently, the output voltage $V_{OUT}$ will decrease instantly, and the feedback voltage $V_{FB}$ on line 16 will decrease proportionally at the same time. As a result, a current $I_2$ flowing through a drain terminal of the PMOS transistor 22 can become larger. A current $I_R$ can flow through the resistors 42 and 41 in an inverse direction shown in FIG. 2. Therefore, the voltage $V_B$ at the node B relatively increases and the voltage $V_A$ at the node A relatively decreases. As a result, a voltage of a gate terminal of the NMOS transistor 27 also decreases since the gate terminal of the NMOS transistor 27 is connected to the node A. A current $I_{27}$ also decreases and a mirrored current $I_{26}$ becomes smaller. A voltage at a gate terminal of the NMOS transistor 28 also increases correspondingly since the gate terminal is connected to the node B. The increase of the gate voltage of the NMOS transistor 28 results in an increase of a current $I_{28}$. Therefore, a voltage of a gate terminal of the PMOS transistor 31 is enforced to discharge so that the voltage of the gate terminal of the PMOS transistor 31 is pulled down. The output current $I_{OUT}$ on line 14 increases as the voltage of the gate terminal of the PMOS transistor 31 become smaller. Accordingly, the increased output current $I_{OUT}$ can charge the load capacitor and the output voltage $V_{OUT}$ will increase. Finally, the output voltage $V_{OUT}$ can be restored to a predetermined value.

On the other hand, if the load current $I_{LOAD}$ decreases, the load capacitor can be charged such that the output voltage $V_{out}$ will become larger. In a transient condition, the feedback voltage $V_{FB}$ on line 16 increases based on a proportion. The increase of the feedback voltage $V_{FB}$ can result in the current $I_2$ decreasing. Consequently, the current $I_R$ flows through the resistors 41 and 42 in a direction as shown in FIG. 2. The voltage at the node A will relatively increase and the voltage at the node B will relatively decrease. A voltage at a gate terminal of the NMOS transistor 27 also increases correspondingly since the gate terminal of the NMOS transistor 27 is connected to the node A. The increase of the voltage at the gate terminal of the NMOS transistor 27 can result in an increase of the current $I_{27}$ flowing through a drain terminal of the PMOS transistor 25. The mirrored current $I_{26}$ produced in the current mirror formed by the PMOS transistors 25 and 26 can increase as the current $I_{27}$ become larger. The decrease of the voltage at the node B will cause the voltage at the gate terminal of the NMOS transistor 28 to become smaller. As a result, the current $I_{28}$ will also decrease correspondingly. Therefore, the current $I_{26}$ flowing through a drain terminal of the PMOS transistor 26 will charge the gate terminal of the PMOS transistor 31 so that the voltage at the gate terminal of the PMOS transistor 31 is rapidly pulled up. As a result, the output current $I_{OUT}$ on line 14 can quickly reduce to a smaller value and the load capacitor can discharge. Consequently, the output voltage $V_{out}$ can rapidly decrease and eventually restored to a predetermined value. Therefore, the gate voltage of the PMOS transistor 31 can vary quickly according to the load current and the slew rate for the gate voltage of the pass device 130 is greatly improved.

Figure 3:
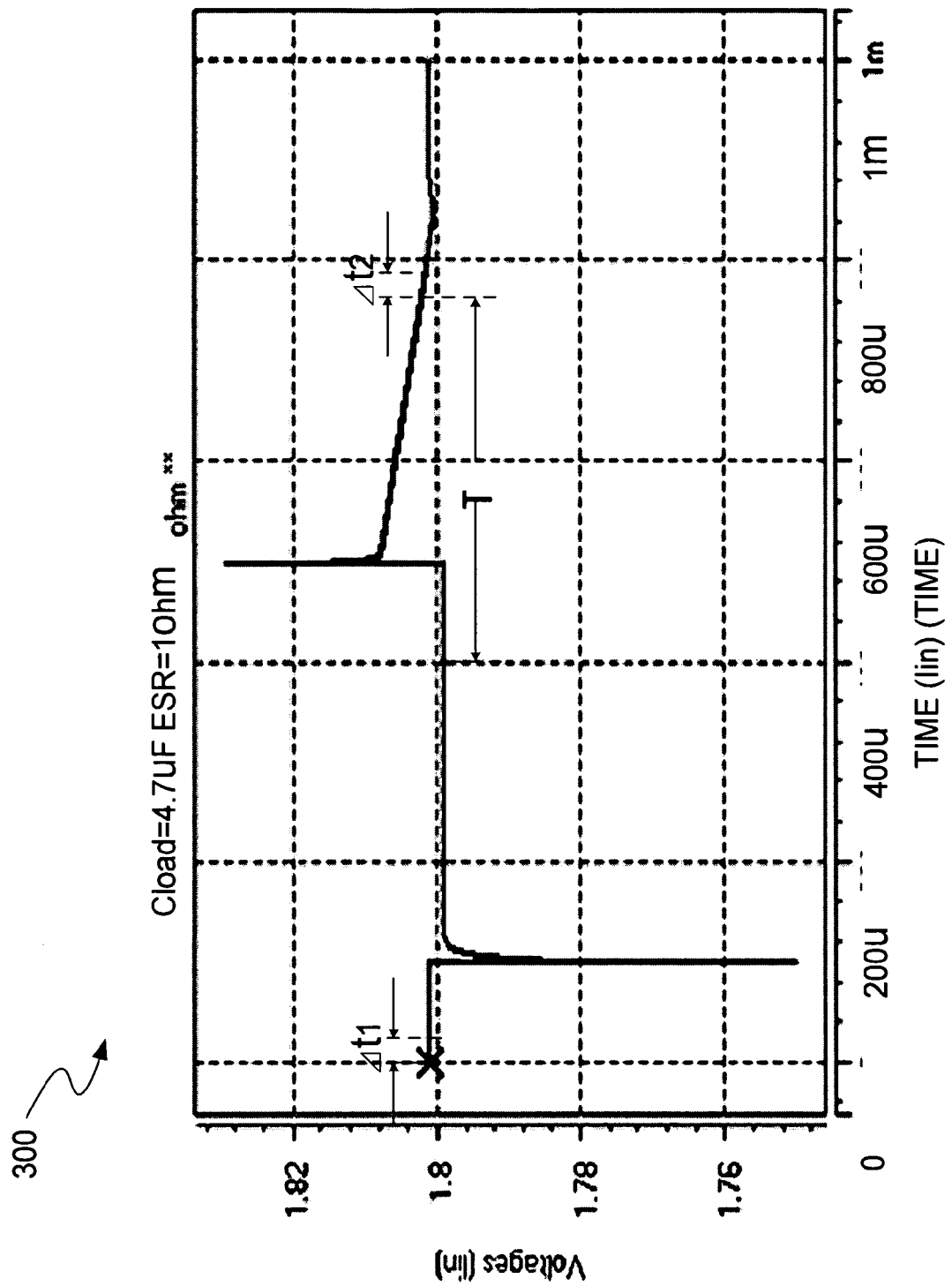
FIG. 3 is a simulation chart of transient response of the LDO voltage regulator of FIG. 2.

With reference to FIG. 3, an exemplary chart 300 of transient response is shown for the LDO voltage regulator 200 in FIG. 2. A undershoot indicates a decrease of the output voltage $V_{OUT}$ on line 14. The LDO voltage regulator 200 can rapidly regulate the variation of the output voltage $V_{OUT}$ and the output voltage $V_{OUT}$ can finally remain a stable value within a shorter time, for example, $\Delta t1$. In contrast, when an overshoot of the output voltage $V_{OUT}$ occurs due to the variation of the external load, the LDO voltage regulator 200 can rapidly lessen the overshoot of the output voltage $V_{OUT}$. Therefore, the LDO voltage regulator 200 can quickly reduce the value of the output voltage $V_{OUT}$ to another stable value within $\Delta t2$.

Figure 4:
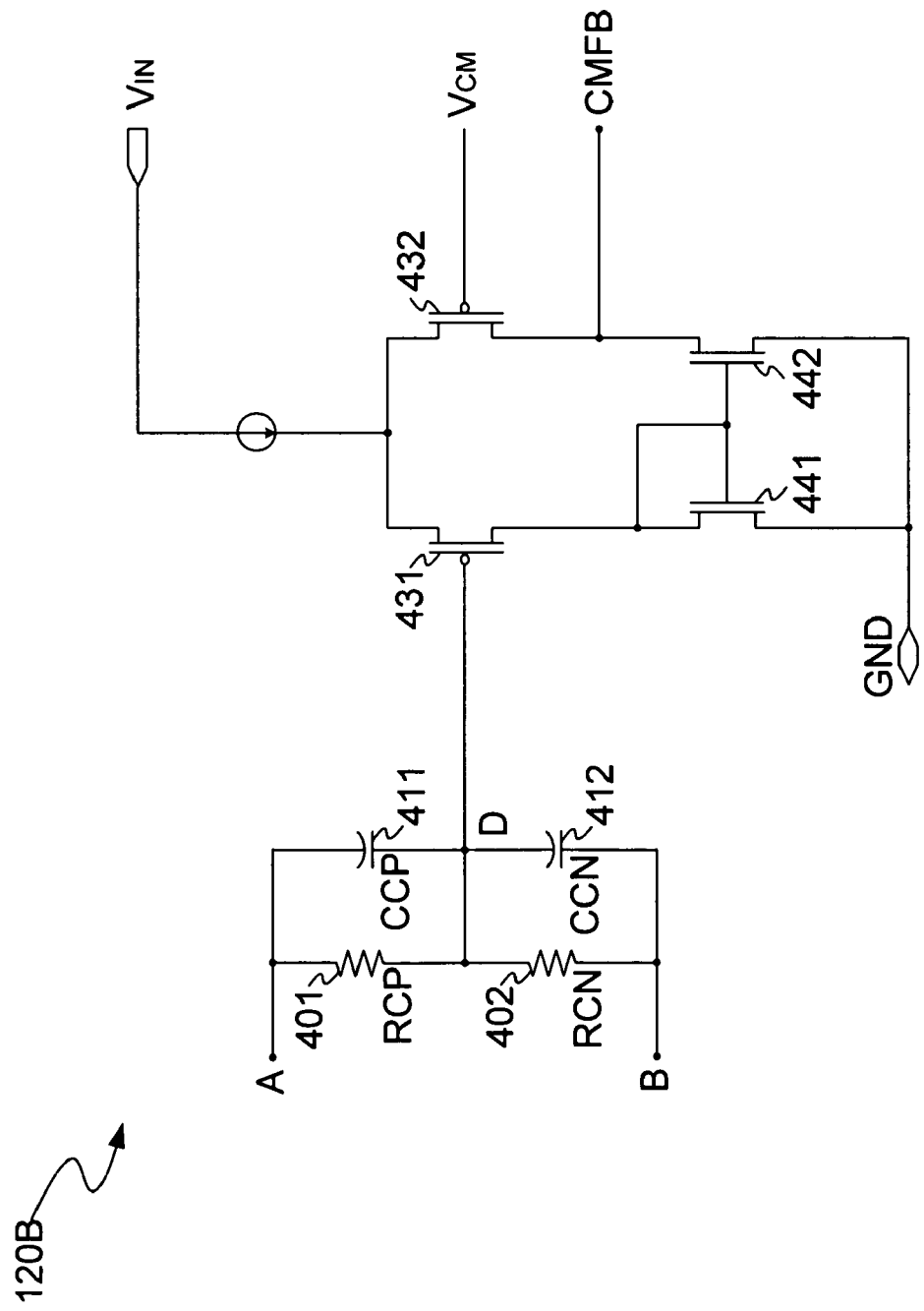
FIG. 4 is a schematic diagram of a common-mode feedback unit according to another embodiment of the invention.
Figure 5:
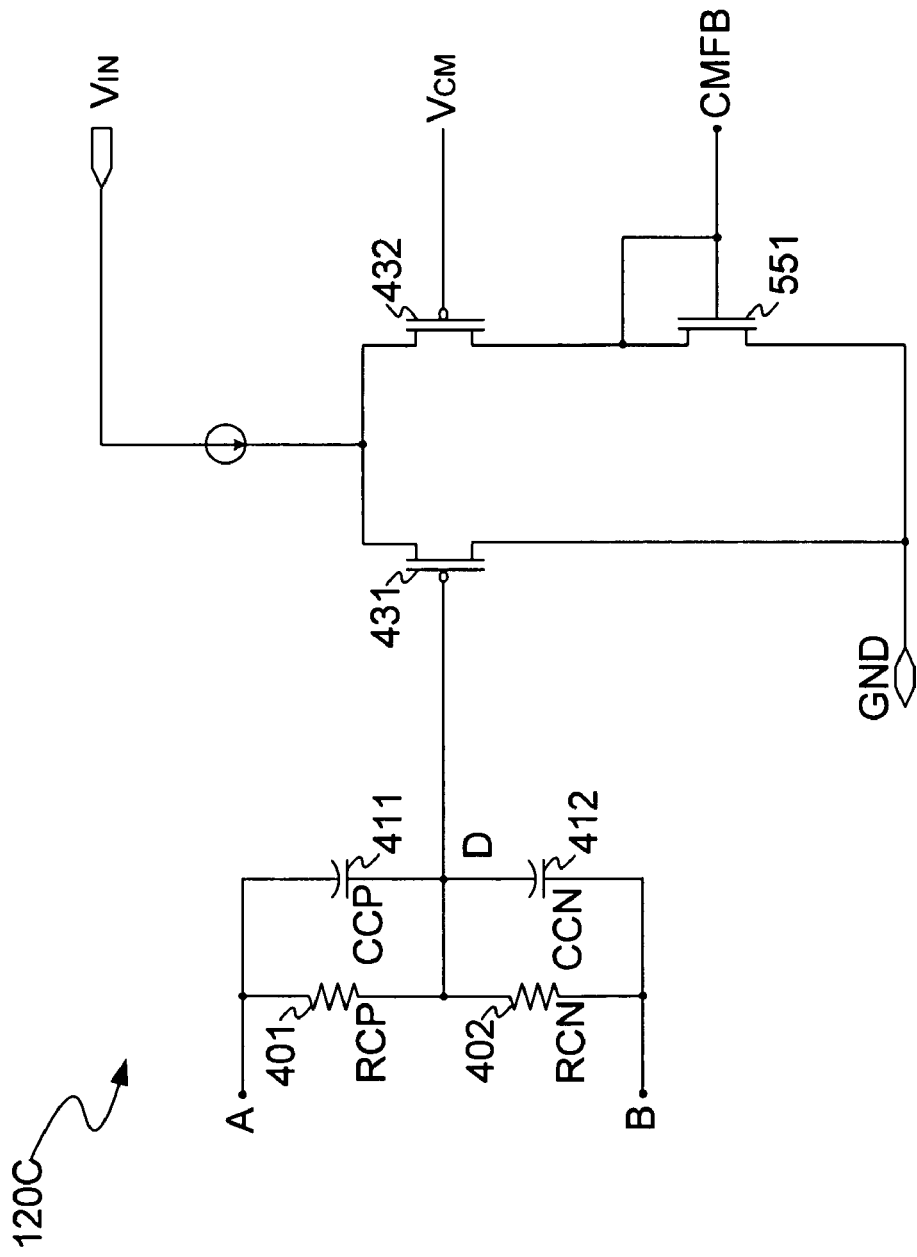
FIG. 5 is a schematic diagram of a common-mode feedback unit according to yet another embodiment of the invention.

For clarity, the other similar components of the LDO voltage regulator 200 in other embodiments will be omitted from FIG. 4 and FIG. 5 and only the configuration difference of the common-mode feedback units will be briefly described. FIG. 4 illustrates a schematic diagram of a common-mode feedback unit 120B according to one embodiment of the invention. The common-mode feedback unit 120B is incorporated in the error amplifier 110 and can replace the common-mode feedback unit 120A. FIG. 5 illustrates a schematic diagram of an alternative common-mode feedback unit 120C according to the invention. The common-mode feedback unit 120C can also be incorporated in the error amplifier 110. The embodiments 120B and 120C in FIG. 4 and FIG. 5 can respectively implement the same function performed by the common-mode feedback unit 120A in FIG. 2 according to the similar principle, which will not be described in details herein.

In FIG. 4, the common-mode feedback unit 120B includes resistors 401 and 402, capacitors 411 and 412, PMOS transistors 431 and 432, and NMOS transistor 441 and 442. The resistor 401 is connected to the node A and the resistor 402 is connected to the node B. A drain terminal of the PMOS transistor 432 is connected to the node CMFB. A source terminal of the PMOS transistor 431 is connected to the DC input voltage $V_{IN}$, a gate terminal of the PMOS transistor 431 is connected to a node D, and a drain terminal of the PMOS transistor 431 is connected to a drain terminal of the NMOS transistor 441. The NMOS transistors 441 and 442 form a mirror current. A source terminal of the PMOS transistor 432 is connected to the DC input voltage $V_{IN}$, a gate terminal of the PMOS transistor 432 is connected to a predetermined voltage, and the drain terminal of the PMOS transistor 432 is connected to a drain terminal of the NMOS transistor 442.

Referring to FIG. 5, the common-mode feedback unit 120C consists of the resistors 401 and 402, capacitors 411 and 412, PMOS transistors 431 and 432, and the NMOS transistor 551. The drain terminal of the PMOS transistor 431 is directly connected to the ground. A drain terminal and a gate terminal of the NMOS transistor 551 are connected to the drain terminal of the PMOS transistor 432, and a source terminal of the NMOS transistor 551 is connected to the ground. The gate terminal of the NMOS transistor 551 is also connected to the node CMFB.

Although the capacitor CC1 is represented in FIG. 2, those skilled in the art will appreciate that other kinds of components may also be used, for example, a poly capacitor or a MOS transistor. Similarly, those skilled in the art will appreciate that a plurality of alterations can be made to implement the feedback circuit 140. For example, a variable resistance can be employed as the resistive divider in the feedback circuit 140. In addition, the type of various MOS transistors in FIG. 2 is not fixed. Those skilled in the art will appreciate that there are other alternatives to the MOS transistors for this embodiment. Other type and other combination of transistors can be employed to implement the function of the error amplifier 110, and the pass device 130 without departing the spirit of the present invention.

Those skilled in the art will appreciate that a plurality of alternatives, modifications and changes can be made for the common-mode feedback unit 120. All these alternatives, modifications and changes are not departing the spirit of the present invention.

In operation, the LDO voltage regulator circuit 100 can receive a DC input signal $V_{IN}$ and export a stable DC output voltage $V_{OUT}$ based on different requirements of a plurality of applications. The error amplifier 110 in the LDO voltage regulator circuit 100 can compare a reference signal $V_{REF}$ and a feedback signal $V_{FB}$ received from the feedback circuit 140, and provide an amplified differential value at its output terminal.

The pass device 130 is driven by the amplified difference value, and it provides a stable output voltage and output a current to various loads of large-scale. When the external load varies in certain situations, the common-mode feedback unit 120 in the error amplifier 110 can rapidly sense the variation of the external load. With the common-mode feedback unit 120, the error amplifier 110 can rapidly charge or discharge the gate terminal of the pass device 130 according to the variation in a transient condition. Therefore, the rapid charging and discharging of the gate terminal greatly improve the slew rate for the gate voltage of the pass device 130.

The feedback circuit 140 can provide a proportional voltage such that a close-loop configuration is formed in the LDO voltage regulator 100. With the compensation circuit 150, the LDO voltage regulator circuit 100 can be ensured to obtain a stable voltage that is less influenced by the external load.

The embodiments that have been described herein are some of the several possible embodiments that utilize this invention and they are described here by way of illustration and not of limitation. It is obvious that many other embodiments, which will be readily apparent to those skilled in the art, may be made without departing materially from the spirit and scope of the invention as defined in the appended claims. Furthermore, although elements of the invention may be described or claimed in the singular, the plural is contemplated unless limitation to the singular is explicitly stated.

What is claimed is:

1. A low drop-out (LDO) voltage regulator circuit with common-mode feedback, comprising:
    an error amplifier with an internal common-mode feedback unit for generating an amplified error voltage, the error amplifier having a first input terminal for receiving a reference voltage, a second input terminal for receiving a feedback voltage, a third input terminal, and an output terminal;
    a pass device for providing an output voltage to at least one external component, the pass device having an input terminal and an output terminal, the input terminal of the pass device being connected to the output terminal of the error amplifier;
    a feedback circuit for scaling down the output voltage, the feedback circuit having a first terminal and a second terminal, the first terminal of the feedback circuit being connected to the output terminal of the pass device, the second terminal of the feedback circuit being connected to the second input terminal of the error amplifier; and
    a compensation circuit for providing frequency compensation, the compensation circuit having a first terminal and a second terminal, the first terminal of the compensation circuit being connected to a common node between the pass device and the feedback circuit, and the second terminal of the compensation circuit being connected to the third terminal of the error amplifier,
    wherein the internal common-mode feedback unit further comprising two resistor-capacitor devices, each resistor-capacitor device comprising a resistor connected in parallel with a capacitor, each resistor-capacitor device having a first terminal and a second terminal, the first terminals of two resistor-capacitor devices being connected to a transistor.

2. The LDO voltage regulator circuit of claim 1, wherein the internal common-mode feedback unit has a first terminal, a second terminal, and a third terminal.

3. The LDO voltage regulator circuit of claim 2, wherein the internal common-mode feedback unit comprises a first resistor having a first terminal and a second terminal and a second resistor having a first terminal and a second terminal, the first terminal of the first resistor being connected to the first terminal of the internal common-mode feedback unit, the second terminal of the second resistor being connected to the second terminal of the internal common-mode feedback unit, and the second terminal of the first resistor and the first terminal of the second resistor being connected to the third terminal of the internal common-mode feedback unit.

4. The LDO voltage regulator circuit of claim 3, wherein the internal common-mode feedback unit further comprising a first capacitor and a second capacitor, the first capacitor being connected in parallel to the first resistor to provide frequency compensation and a second capacitor is connected in parallel to the second resistor to provide frequency compensation.

5. The LDO voltage regulator circuit of claim 2, wherein the internal common-mode feedback unit comprises a first resistor having a first terminal and a second terminal, a second resistor having a first terminal and a second terminal, a first PMOS transistor, a second PMOS transistor, a first NMOS transistor, and a second NMOS transistor.

6. The LDO voltage regulator circuit of claim 5, wherein the first terminal of the first resistor is connected the first terminal of the internal common-mode feedback unit, the second terminal of the first resistor and the first terminal of the second resistor are connected to a common node, and the second terminal of the second resistor is connected to the second terminal of the internal common-mode feedback unit.

7. The LDO voltage regulator circuit of claim 6, wherein a source terminal of the first PMOS transistor is connected to a source terminal of the second PMOS transistor, a gate terminal of the first PMOS transistor is connected to the common node, and a drain terminal of the first PMOS transistor is connected to a drain terminal of the first NMOS transistor.

8. The LDO voltage regulator circuit of claim 5, wherein a gate terminal of the second PMOS transistor is connected to a predetermined voltage, and a drain terminal of the second PMOS transistor is connected to the third terminal of the internal common-mode feedback unit.

9. The LDO voltage regulator circuit of claim 5, wherein a gate terminal of the first NMOS transistor is connected to a gate terminal of the second NMOS transistor, and a source terminal of the first NMOS transistor is connected to the ground.

10. The LDO voltage regulator circuit of claim 5, wherein a drain terminal of the second NMOS transistor is connected to the third terminal of the internal common-mode feedback unit, and a source terminal of the second NMOS transistor is connected to the ground.

11. The LDO voltage regulator circuit of claim 5, wherein the internal common-mode feedback unit further comprising a first capacitor and a second capacitor, the first capacitor being connected in parallel to the first resistor to provide frequency compensation and a second capacitor is connected in parallel to the second resistor to provide frequency compensation.

12. The LDO voltage regulator circuit of claim 2, wherein the internal common-mode feedback unit comprises a first resistor having a first terminal and a second terminal, a second resistor having a first terminal and a second terminal, a NMOS transistor, a first PMOS transistor, and a second PMOS transistor.

13. The LDO voltage regulator circuit of claim 12, wherein the first terminal of the first resistor is connected to the first terminal of the internal common-mode feedback unit, the second terminal of the first resistor and the first terminal of the second resistor are connected to a common node, and the second terminal of the second resistor is connected to the second terminal of the internal common-mode feedback unit.

14. The LDO voltage regulator circuit of claim 12, wherein a source terminal of the first PMOS transistor is connected to a source terminal of the second PMOS transistor, a gate terminal of the first PMOS transistor is connected to the common node, and the drain terminal of the first PMOS transistor is connected to the ground.

15. The LDO voltage regulator circuit of claim 12, wherein a gate terminal of the second PMOS transistor is connected to a predetermined voltage, and a drain terminal of the second PMOS transistor is connected to the third terminal of the internal common-mode feedback unit.

16. The LDO voltage regulator circuit of claim 12, wherein a drain terminal and a gate terminal of the NMOS transistor are connected to the third terminal of the internal common-mode feedback unit, and the source terminal of the NMOS transistor is connected to the ground.

17. The LDO voltage regulator circuit of claim 12, wherein the internal common-mode feedback unit further comprising a first capacitor and a second capacitor, the first capacitor being connected in parallel to the first resistor to provide frequency compensation and a second capacitor is connected in parallel to the second resistor to provide frequency compensation.

18. The LDO voltage regulator circuit of claim 1, wherein the error amplifier further comprises a capacitor for optimizing compensation.

19. The LDO voltage regulator circuit of claim 1, wherein the error amplifier further comprises a metal oxide semiconductor (MOS) transistor for optimizing compensation.

20. The LDO voltage regulator circuit of claim 1, wherein the pass device comprises a MOS transistor.

21. A method for outputting a stable voltage in a low drop-out (LDO) voltage regulator circuit with common-mode feedback, comprising the steps for:
generating an amplified voltage at an error amplifier;
driving a pass device with the amplified voltage;
increasing a slew rate for a gate voltage of the pass device through use of an internal common-mode feedback unit in the error amplifier;
obtaining an output voltage from the pass device;
generating a feedback voltage through division of the output voltage at a feedback circuit; and
providing frequency compensation at a compensation circuit to the LDO voltage regulator to stabilize the output voltage, wherein the compensation circuit is connected between the error amplifier and a common node between the pass device and the feedback circuit.

22. The method of claim 21, further comprising the steps of:
receiving a reference voltage; and
receiving the feedback voltage, where the reference voltage and the feedback voltage being used to generate the amplified voltage.

23. The LDO voltage regulator circuit of claim 1, wherein the compensation circuit is a capacitor.

* * * * *